(12) United States Patent
Kwon et al.

(10) Patent No.: US 6,556,085 B2
(45) Date of Patent: Apr. 29, 2003

(54) LOW POWER LOW NOISE AMPLIFIER

(75) Inventors: Ick Jin Kwon, Taejon (KR); Joon Ho Gil, Taejon (KR); Hyung Cheol Shin, Taejon (KR)

(73) Assignee: Korea Advanced Institute of Science and Technology, Taejon (KR)

( * ) Notice: Subject to any disclaimer, the term of this patent is extended or adjusted under 35 U.S.C. 154(b) by 0 days.

(21) Appl. No.: 09/828,181

(22) Filed: Apr. 9, 2001

(65) Prior Publication Data

US 2002/0084855 A1 Jul. 4, 2002

(30) Foreign Application Priority Data

Dec. 28, 2000 (KR) ........................................ 2000-83709

(51) Int. Cl.[7] ................................................ H03F 1/22
(52) U.S. Cl. .................... 330/311; 330/285; 330/302
(58) Field of Search ................................. 330/285, 302, 330/311, 98, 99, 100

(56) References Cited

U.S. PATENT DOCUMENTS

| | | | | |
|---|---|---|---|---|
| 4,182,992 A | * | 1/1980 | Attwood | 330/251 |
| 4,366,450 A | * | 12/1982 | Suganuma | 330/285 |
| 4,940,949 A | * | 7/1990 | Landi | 330/262 |
| 6,333,677 B1 | * | 12/2001 | Dening | 330/296 |

* cited by examiner

*Primary Examiner*—Henry Choe
(74) *Attorney, Agent, or Firm*—Bacon & Thomas

(57) ABSTRACT

A low power low noise amplifier achieves a high power gain without increasing power consumption by sharing the bias current. The amplifier is composed of a cascade structure which consists of a parallel connected common source transistor and common gate transistor connected to a common source transistor, an inverter type structure connected to the common source transistor, and structure improving the third-order intermodulation component using the parallel connected common source transistor and common gate transistor.

1 Claim, 5 Drawing Sheets

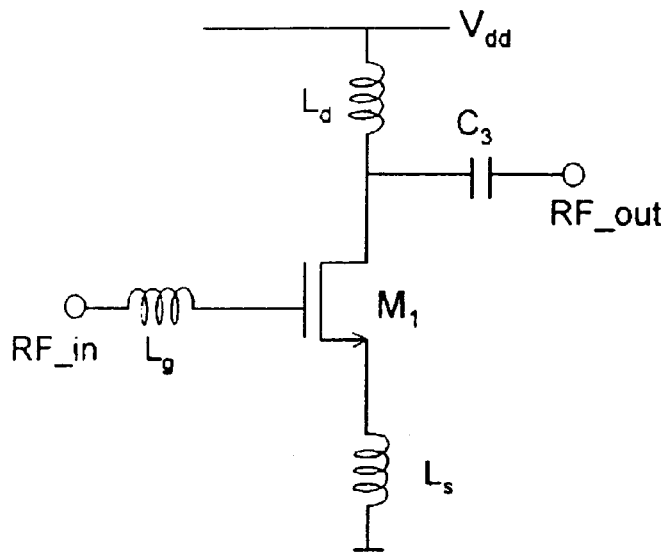
FIG. 1    (PRIOR ART)
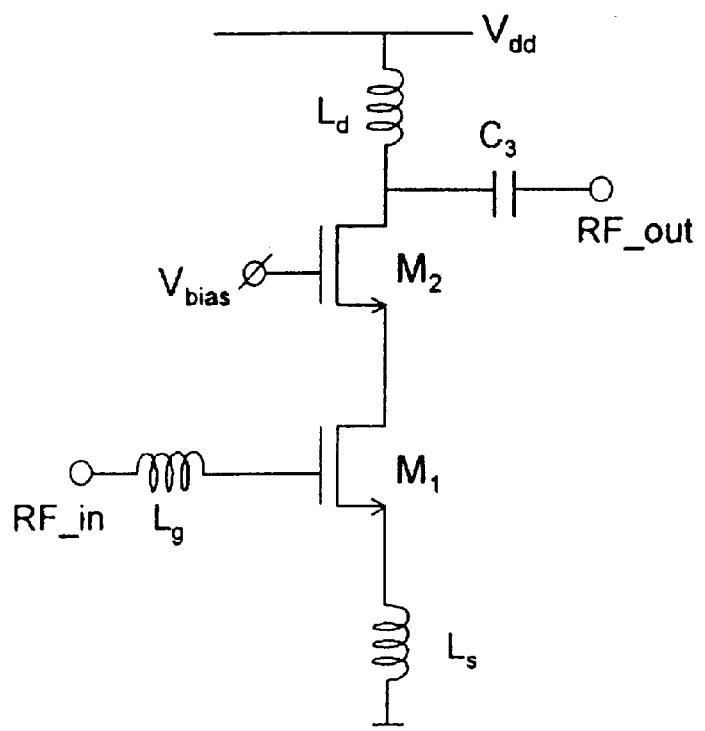
FIG. 2    (PRIOR ART)

LOW POWER LOW NOISE AMPLIFIER

BACKGROUND OF THE INVENTION

1. Field of the Invention

The present invention related to a low power low noise amplifier, more particularly to the low power low noise amplifier which gives high power gain with low power consumption by improving the conventional low noise amplifier.

2. Description of the Related Art

A low noise amplifier (LNA), which is used for RF receiver in a wireless communication application, is used necessarily at a receiver for obtaining power gain and decreasing noise factor (NF).

A RF system in a wireless communication application requires a low power structure especially for portable communication system. Therefore, it should be designed to be consumed the least power within the range which can be satisfied in.

However, the conventional low noise amplifier needs high power consumption at the RF receiver to satisfy the required power gain and characteristics compared to the present invention. The conventional LNA uses one unit common source amplifier structure showing as FIG. 1 or cascode amplifier structure showing as FIG. 2.

SUMMARY OF THE INVENTION,

However, in the conventional amplifier structure, high power gain cannot be obtained due to low transconductance when the amplifier is operated with low power using low bias current. Therefore, it is difficult to obtain high enough linearity and power gain in an RF receiver with low power.

So, the present invention contrived to solve the above mentioned problem is proposed to improve linearity and to obtain high power gain with low power.

To reach the proposed purpose, a parallel-connected common source transistor and common gate transistor are arranged to share a bias current.

The present invention is characterized by having a structure that improves linearity with low power consumption by using a third order intermodulation component with the parallel-connected common source transistor and common gate transistor.

BRIEF DESCRIPTION OF THE DRAWINGS

FIG. 1 is a low noise amplifier structure which has the conventional common source configuration.

FIG. 2 is a low noise amplifier structure which has the conventional cascode configuration.

DETAILED DESCRIPTION OF THE EMBODIMENTS

Hereafter, an embodiment according to the present invention is described in detail by referring to accompanying drawings.

Figure 3:
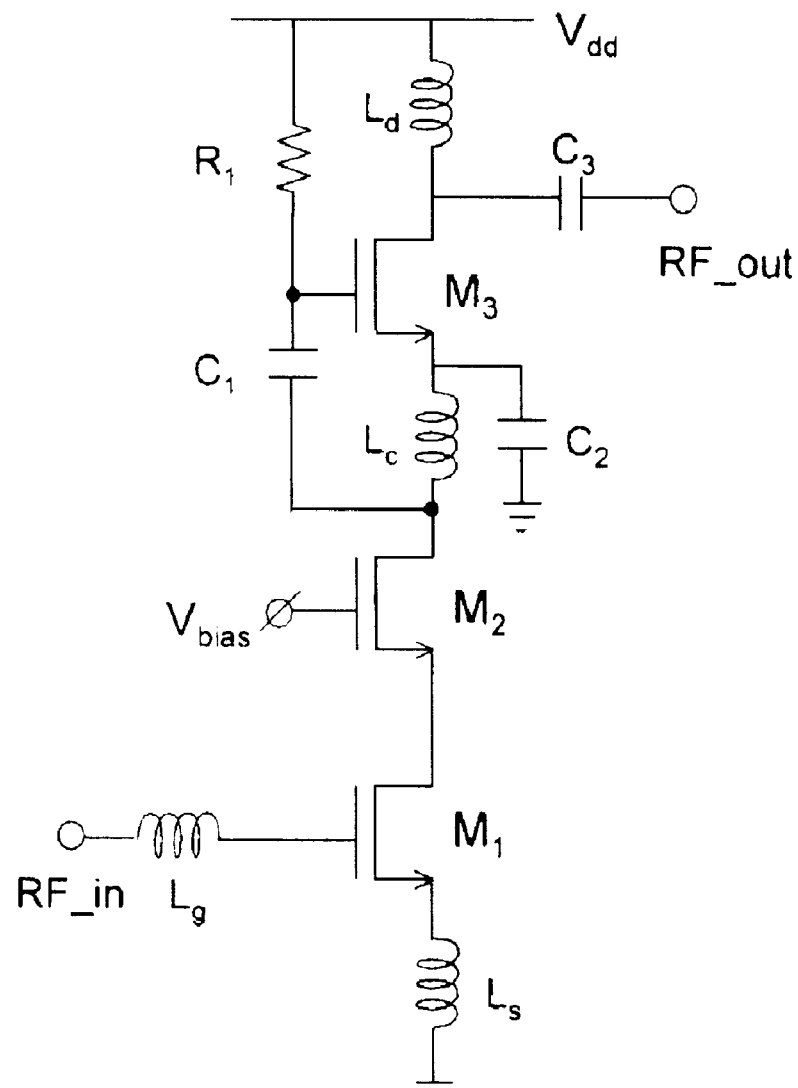
FIG. 3 is a circuit diagram of a low power low noise amplifier according to the first embodiment of the present invention.

FIG. 3 is the first embodiment of the present invention.

Herein, inductors $L_g$ and $L_s$ are used for matching input impedance, and inductor $L_d$ and capacitor $C_3$ are used for matching output impedance.

Herein, the capacitor $C_2$ is a bypass capacitor. So, source of common source component transistor $M_3$ is bypassed by the $C_2$.

In this structure, the signal amplified as much the gain by cascode structure composed of transistors $M_1$ and $M_2$ is amplified through coupling to the gate of common source transistor $M_3$ by capacitor $C_1$.

The entire gain is obtained by multiplying of the gain of cascode amplifier and common source amplifier. Therefore, the high power gain can be obtained compared to the conventional common source amplifier or cascode amplifier.

Herein, transistors $M_1$ and $M_2$ are operated as cascode amplifier, and transistor $M_3$ is used as common source amplifier, and there is no increase of the bias current because the bias current is shared. Therefore, higher power gain can be obtained when the same power is used. Also, lower power is consumed to obtain the same power gain.

Figure 4:
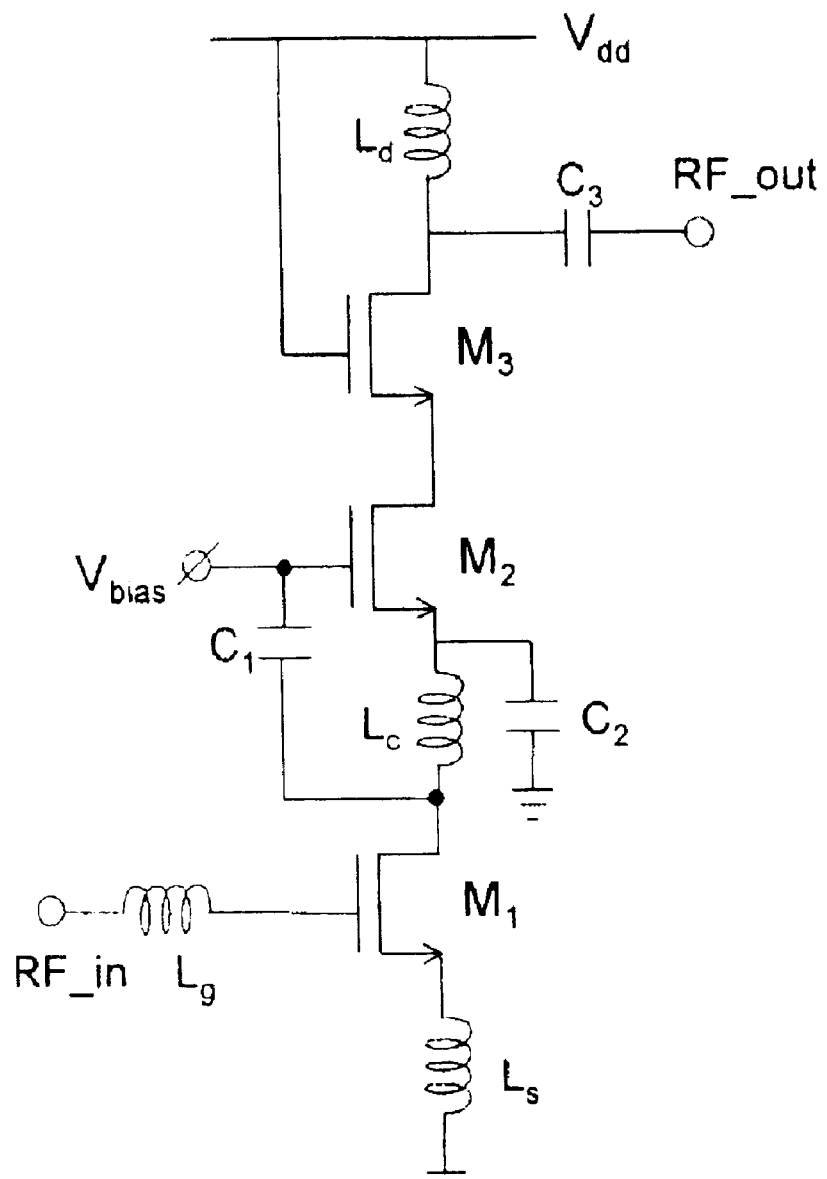
FIG. 4 is a circuit diagram of a low power low noise amplifier according to the second embodiment of the present invention.

FIG. 4 is the second embodiment of the present invention.

In this structure, the signal amplified by common source component transistor $M_1$ is coupled to gate of transistor $M_2$ by capacitor $C_1$ and is output after being amplified as much as the gain by the cascode structure composed of the said transistors $M_1$ and $M_2$.

Herein, transistor $M_1$ is operated as a common source amplifier, and transistors $M_2$ and $M_3$ are operated as a cascode amplifier, and because the bias current is shared, there is no increase of the bias current. In this case, source of transistor $M_2$ is bypassed by capacitor $C_2$.

The entire gain is obtained by multiplying of the gain of cascode amplifier and common source amplifier. Therefore, the high power gain can be obtained compared to the conventional common source amplifier or cascode amplifier.

Figure 5:
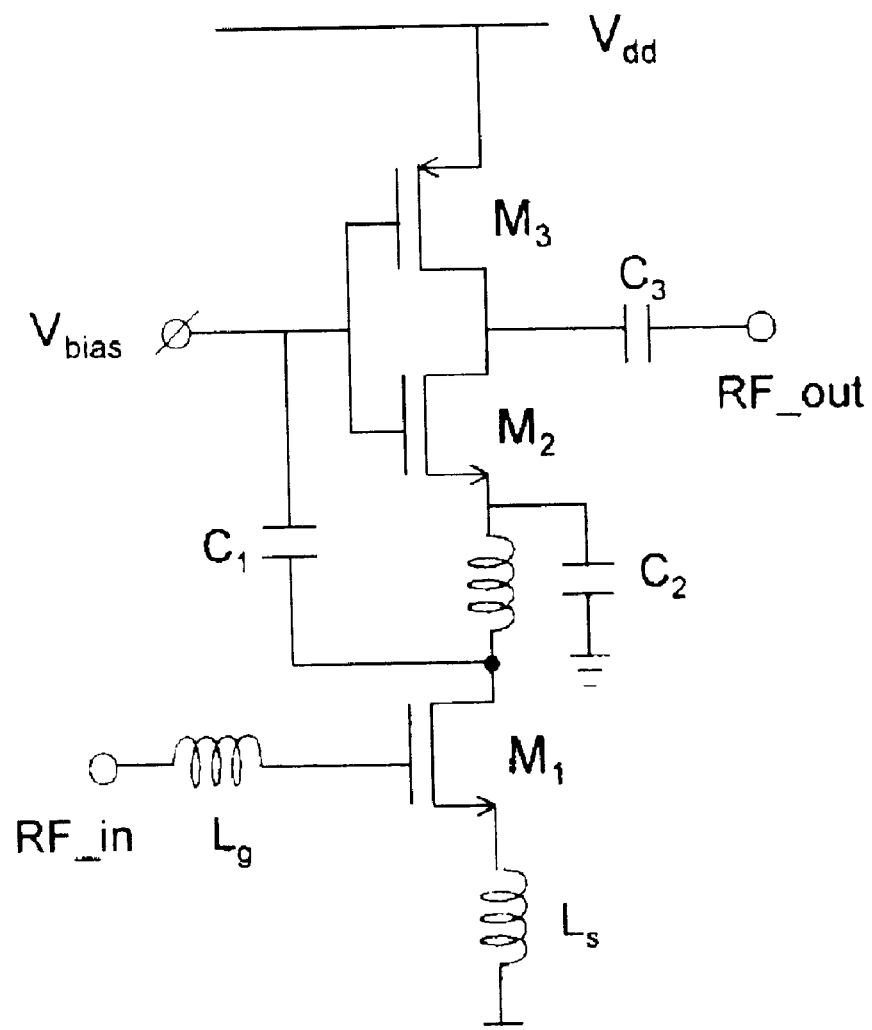
FIG. 5 is a circuit diagram of a low power low noise amplifier according to the third embodiment of the present invention.

FIG. 5 is the third embodiment of the present invention.

In this structure, the signal amplified by transistor $M_1$ is coupled by N-type transistors $M_2$ and P-type transistor $M_3$ and then is output.

This structure gives higher power gain by sharing the bias current compared to the conventional structure and compensates linearity got worse in the high power gain structure.

The inverter type amplifier unit composed of transistors $M_2$ and $M_3$ have good linearity by push-pull operating, and it increases the linearity of the entire low noise amplifier.

Also, by sharing the bias current, higher power gain can be obtained with low current compared to the conventional common source amplifier or inverter type amplifier.

Figure 6:
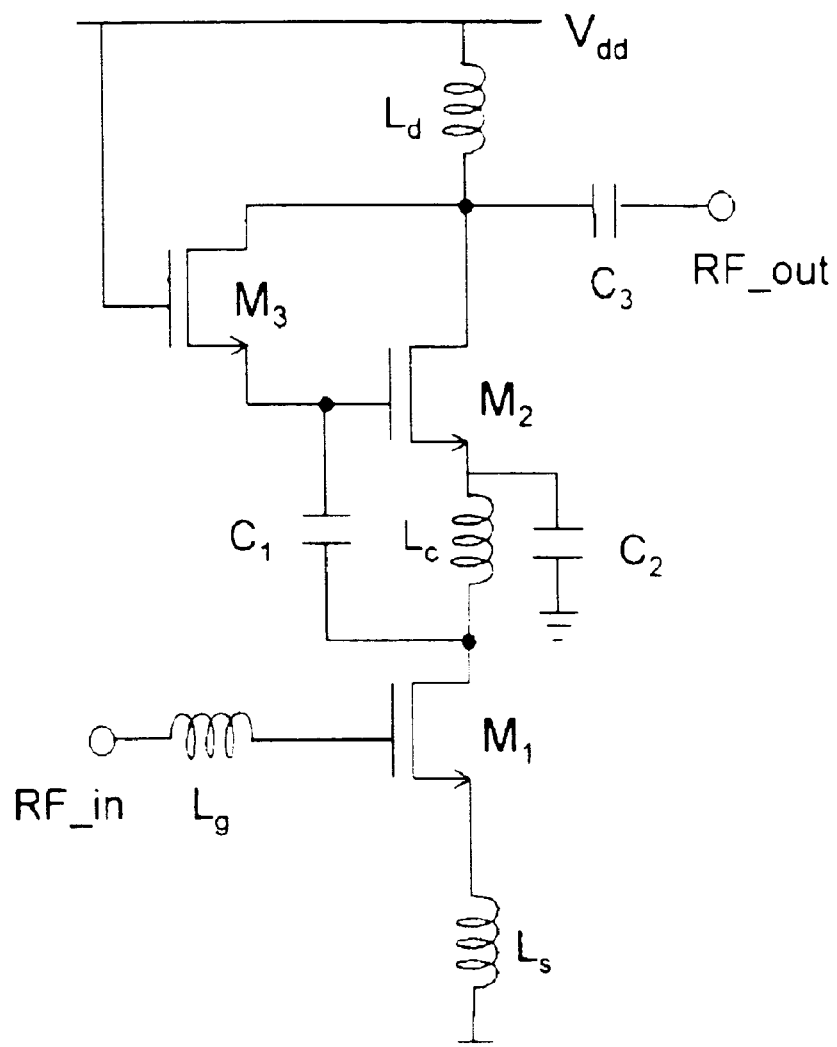
FIG. 6 is a circuit diagram of a low power low noise amplifier according to the fourth embodiment of the present invention.

FIG. 6 is the fourth embodiment of the present invention.

The signal amplified by common source transistor $M_1$ is coupled by capacitor $C_1$ and then is applied to the gate of the common source transistor $M_2$ and the source of the common gate transistor $M_3$.

The drains of the common source transistor $M_2$ and common gate transistor $M_3$ are connected by output, and the third-order intermodulation outputs of transistors $M_2$ and $M_3$ have opposite polarity each other so that the total third-order intermodulation is cancelled.

Here, the signal amplified by common source transistor $M_2$ and common gate transistor $M_3$ has 180 degree phase difference, so, the entire linearity can be improved by satisfying the condition which is minimizing the decrease of fundamental component by adjusting bias current and transistor size meanwhile maximizing the cancellation of the third-order harmonic component.

As mentioned above, the present invention achieves a lower power design by sharing the bias current.

Also, the present invention can improve the linearity by harmonic cancellation.

What is claimed is:

1. A low power low noise amplifier, comprising:
    a common source transistor $M_1$;
    a common source transistor $M_2$;
    a common gate transistor $M_3$ having a drain connected to a drain of the common source transistor $M_2$;
    a capacitor $C_1$ having one end coupled to a drain of the common source transistor $M_1$ and a second end coupled to a gate of the common source transistor $M_2$ and to a source of the common gate transistor $M_3$,
  wherein a signal amplified by the common source transistor $M_1$ is amplified after being coupled by capacitor $C_1$ and then being applied to the gate of the common source transistor $M_2$, a third-order intermodulation output of transistors $M_2$ and $M_3$ have opposite polarity to each other so that a total third-order intermodulation is cancelled at said connection between the drains of the transistors $M_2$ and $M_3$, and the transistors $M_1$, $M_2$, and $M_3$ share a bias current.

* * * * *